United States Patent [19]

Larabell

[11] Patent Number: 5,518,418
[45] Date of Patent: May 21, 1996

[54] SCSI ID CONNECTOR ASSEMBLY

[75] Inventor: Henri J. Larabell, Cupertino, Calif.

[73] Assignee: HJS & E Engineering, Sunnyvale, Calif.

[21] Appl. No.: 359,242

[22] Filed: Feb. 14, 1994

[51] Int. Cl.[6] .......................... H01R 11/00; H01R 29/00
[52] U.S. Cl. .................. 439/505; 439/218; 439/623; 439/928.1
[58] Field of Search ................ 439/61, 502, 505, 439/218, 623, 928.1; 361/685, 725, 727

[56] References Cited

U.S. PATENT DOCUMENTS

| | | | |
|---|---|---|---|
| 3,581,268 | 5/1971 | Akst | 439/507 |
| 4,025,139 | 5/1977 | Martucci | 439/106 |
| 4,146,291 | 3/1979 | Goff et al. | 439/88 |
| 4,973,264 | 11/1990 | Kamono et al. | 439/498 |
| 4,988,890 | 1/1991 | Nahri et al. | 439/505 |
| 5,195,022 | 3/1993 | Hoppal et al. | 361/685 |
| 5,299,944 | 4/1994 | Larabell et al. | 439/157 |

FOREIGN PATENT DOCUMENTS 1114461  5/1968  United Kingdom.

*Primary Examiner*—Neil Abrams
*Attorney, Agent, or Firm*—Douglas A. Chaikin; Kevin H. Fortin

[57] ABSTRACT

Disclosed herein is a SCSI ID connector assembly 20 connectable with a carrier (24) which supports memory storage devices having ID ports. The SCSI ID connector assembly (20) has various connectors including a first terminal (50), a feed-through connector (52) and a second terminal (54). The feed-through connector (52) is compatible with one type of ID port and the second terminal (54) is compatible with another type of ID port. The first terminal (50) is divided into a ground plug (186) and a separate active plug (188). The active plug (188)is selectively rotatable about its axis to reverse bit sequences. Accordingly, the SCSI ID connector assembly is compatible with a variety of ID port types.

21 Claims, 8 Drawing Sheets

FIG.—3

SCSI ID CONNECTOR ASSEMBLY

RELATED U.S. PATENT APPLICATIONS AND PATENTS

This present invention is related in subject matter to U.S. Pat. No. 5,299,944 issued Apr. 5, 1994; to commonly assigned U.S. patent application Ser. No. 08/272,702 filed Jul. 7, 1994; and to commonly assigned U.S. patent application, Ser. No. 08/157,675, filed Nov. 24, 1993. The disclosure of the related patent and patent applications is incorporated herein by reference.

BACKGROUND OF THE INVENTION

1. Field of the Invention

This invention relates to connector assemblies which interconnect electrical devices with equipment flames. More particularly, this invention relates to SCSI ID connector assemblies which interconnect memory storage devices with SCSI ID switches.

2. Previous Art

During the last decade, the computer industry has seen changes in data storage technology. Common floppy disks, hard disks and optical disks are characterized by relatively large storage capacities when compared with the capacity of memory storage devices of a decade ago. As larger storage capacities become available, a corresponding increase in the demand for data transfer capability follows.

The exchange of floppy disks enables data transfer between computers. This capability is limited by floppy disk capacity. Generally, a floppy disk will have a capacity of 1.4 megabytes of storage capacity. To transfer a gigabyte of data, for example, could require a box of nearly ten floppy disks and an hour of time. The relatively small storage capacity which typical floppy disks contain limits the usefulness of floppy disks to facilitate data transfer between computers. More time efficient ways of transferring data from one computer to another are desired.

In various computer systems, the concept of "hot swappability" of memory storage devices has been introduced. Hot swappability allows a memory storage device, typically a hard disk, to be removed from or installed into an equipment frame. The equipment frame maintains communication with the computer system or other system. The computer system power unit remains turned on, the keyboards and input devices are functional, and the screen continues to display information during hot swapping. An operator can continue uninterrupted work with the computer system while memory storage devices are exchanged, for example.

One way to facilitate hot swappability of memory storage devices is with an equipment frame having specialized equipment "slides" which are stacked in rows and columns in the equipment frame. A carrier connects with each slide. The carrier holds a memory storage device or other electronic device. An example of a slide and carrier which connect with electronic equipment such as a computer is disclosed in U.S. Pat. No. 5,299,944 which is incorporated herein by reference. Memory storage devices can also be affixed directly to the equipment frame to establish an electronicall connection thereto.

The memory storage devices include hard disk drives, optical disks and tape drives for example, and circuit boards. Such devices can be mounted in various types of equipment frames which are adapted to hold numerous memory storage devices and memory storage device types.

Large numbers of memory storage devices can be stacked in a particular equipment frame. To locate a particular memory storage device, identification of each attached memory storage device is desirable. Accordingly, many memory storage devices are equipped with an identification (ID) port. The ID port electronically communicates memory storage device with the carrier to identify the memory storage device. Each memory storage device location may have an assigned ID label, or, an ID switch provided with the equipment frame assigns an ID label.

There are many types of hard disks available to interconnect with an equipment frame. The ID ports of each hard disk must be compatible for connection with the ID switch, for example. Industry standards, however, do not mandate every detailed interconnection between a hard disk and an equipment frame such as one which supports a carrier. Providing a SCSI ID connector assembly which is compatible with a variety of ID ports available with various memory storage devices is desired.

Typically, ID ports of a memory storage device include ground connectors and bit carrying connectors which communicate information in a specific ID sequence to identify the associated memory storage device. This ID sequence varies between memory storage device types and prevents the interchange of the memory storage devices. What is needed is an ID connector assembly which is adapted for interconnecting various ID ports having varied ID sequences.

The location of the ID ports on each hard disk may vary. In many cases, little space exists between the disk drive and the equipment frame. What is needed is an ID connector assembly which is flexible and consumes a minimal amount of space.

The geometry, and shape of ID ports on various memory storage devices vary. What is needed is an ID connector assembly which is adapted to attach to various ID ports having different geometry and shape.

SUMMARY AND OBJECTS OF THE INVENTION

It is an object of the invention to provide an ID connector assembly which is adapted to interconnect various electrical devices such as memory storage devices to an equipment frame.

It is a further object of this invention to provide a device which consumes a minimal amount of space.

It is an object of this invention to provide an ID connector assembly which has a reversible connector for interconnecting various ID ports having varied ID sequences.

In accordance with the above objects and those that have been mentioned and those that will be mentioned and will become apparent below, one embodiment of the present invention is a SCSI ID connector assembly connectable with an electrical device and an equipment frame, comprising:

an ID bus formed with a first end and a second end;

a first terminal attached to the first end of the ID bus;

a feed-through connector attached to the ID bus; and a second terminal attached to the second end of the ID bus, whereby the first terminal is connectable with the equipment frame, the second terminal and the feed-through connector are selectively connectable with the electrical device.

In a preferred embodiment, the first terminal includes an active plug and a ground plug, the active plug and the ground plug are independently attachable to the equipment In another preferred embodiment, the active plug reversibly attaches to the equipment frame.

In another preferred embodiment, the equipment frame includes a carrier with a manually operable ID switch, the first terminal attaches to the manually operable ID switch.

In another preferred embodiment, the carrier has a carrier ID terminal, the first terminal of the ID connector assembly attaches to the carrier ID terminal.

In another preferred embodiment, the carrier is attachable with a slide.

In another preferred embodiment, the electrical device is a memory storage device.

It is an advantage of the present invention to provide a SCSI ID connector assembly which connects with a variety of electrical devices such as hard disk drives.

It is a further advantage of the present invention to provide a SCSI ID connector assembly which consumes a minimal amount of space.

It is a further advantage of the present invention to provide a SCSI ID connector assembly having a connector which is reversible to connect with various memory storage devices including those having opposing ID bit sequences.

It is a further advantage of the present invention to provide a SCSI ID connector assembly which has various connectors to enable connection of the SCSI ID connector assembly with any of a number of memory storage devices.

BRIEF DESCRIPTION OF THE DRAWINGS

For a further understanding of the objects and advantages of the present invention, reference should be given to the following detailed description, taken in conjunction with the accompanying drawings, in which like parts are given like reference numerals and wherein.

DETAILED DESCRIPTION

Figure 1:
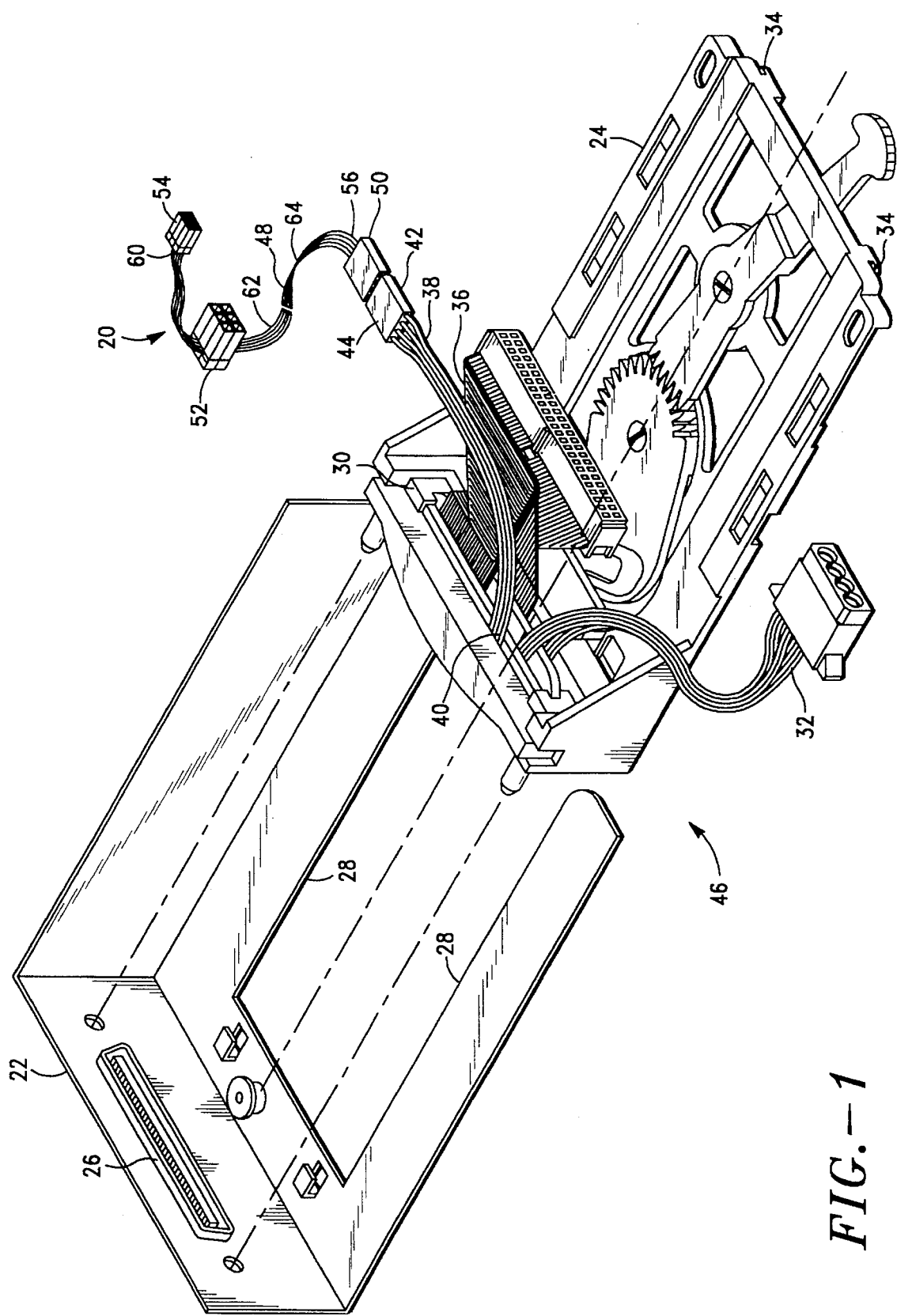
FIG. 1 is a perspective view of a SCSI ID connector assembly attached to an equipment frame having a slide and a carrier in accordance with the present invention.

With particular reference to FIG. 1, a Small Computer Standard Interface (SCSI) ID connector assembly is shown generally designated by the reference numeral 20. The SCSI ID connector assembly 20 connects with an equipment frame generally designated by the reference numeral 46. The equipment frame 46 can be electronically connected with a computer system to facilitate hot swappability of memory storage devices.

The equipment frame 46 includes a slide 22 and a carrier 24. The carrier 24 mates with the slide 22. The slide 22 includes an electrical connector 26 and a pair of rails 28. The carrier 24 includes an electrical connector 30, a pair of grooves 34. The grooves 34 of the carrier 24 mate with the rails of the slide 22. The SCSI ID connector attaches to the carrier 24.

The carrier 24 includes an electrical connector 30 and a wiring harness 36. A carrier ID cable assembly 38 and a power cord 32 are included with the wiring harness 36. The electrical connector 20 interconnects the wiring harness 36 with the electrical connector 30 when the carrier 24 mates with the slide 22. The carrier 24 locks in a mating position with the slide 22. Examples of carriers are described in commonly assigned U.S. patent application Ser. No. 08/272,702 entitled *Geared Bracket and Slide Assembly*, filed Jul. 7, 1994; and in U.S. Pat. No. 5,299,934, the disclosures of which are incorporated herein by reference.

The SCSI ID connector assembly 20 includes an ID bus 48, a first terminal 50, a feed-through connector 52 and a second terminal 54. The first terminal 50 attaches with the carrier ID cable assembly 38.

The carrier ID cable assembly 38 has a first end 40 and a second end 42. The first end 40 of the carrier ID cable assembly 38 connects with the electrical connector 26 of the slide 22. The second end 42 of the carrier ID cable assembly 38 includes an ID terminal 44. The first terminal 50 of the SCSI ID connector assembly connects with the ID terminal 44 of the carrier ID cable assembly 38.

Each terminal 50 and 54 and the feed-through connector 52 of the SCSI ID connector assembly 20 are attached electronically to the ID bus 48.

The ID bus 48 has a first end 56 and a second end 60. The first terminal 50 of the SCSI ID connector assembly 20 attaches to the first end 56 of the ID bus 48. The second terminal 54 of the SCSI ID connector assembly 20 attaches to the second end 60 of the ID bus 48. The feed-through connector 52 attaches to the ID bus 48 between each end 56 and 60 of the ID bus 48.

The first terminal 50 removably attaches with the ID terminal 44 of the carrier ID cable assembly 38. The feed-through connector 52 and the second terminal 54 are selectively connectable with the memory storage device 66 (see FIG. 2).

The ID bus 48 is an electrical conductor assembly for collecting electrical currents and selectively distributing the electrical currents to an electrical device. Preferably, the ID bus 48 is a ribbon cable having multiple discrete wires 62 to enable simultaneous transmission of bits of information. The ID bus 48 flexes, folds and bends to conserve space and permit the SCSI ID connector assembly 20 to fit between a memory storage device 66 (see FIG. 2) and the slide 22.

Although the ID bus 48 shown in FIG. 1 is a ribbon cable, other types of electrical conductors can be used in accordance with the present inventive concept such as, for example, a bundle of wires or discrete conductive strips.

Figure 2:
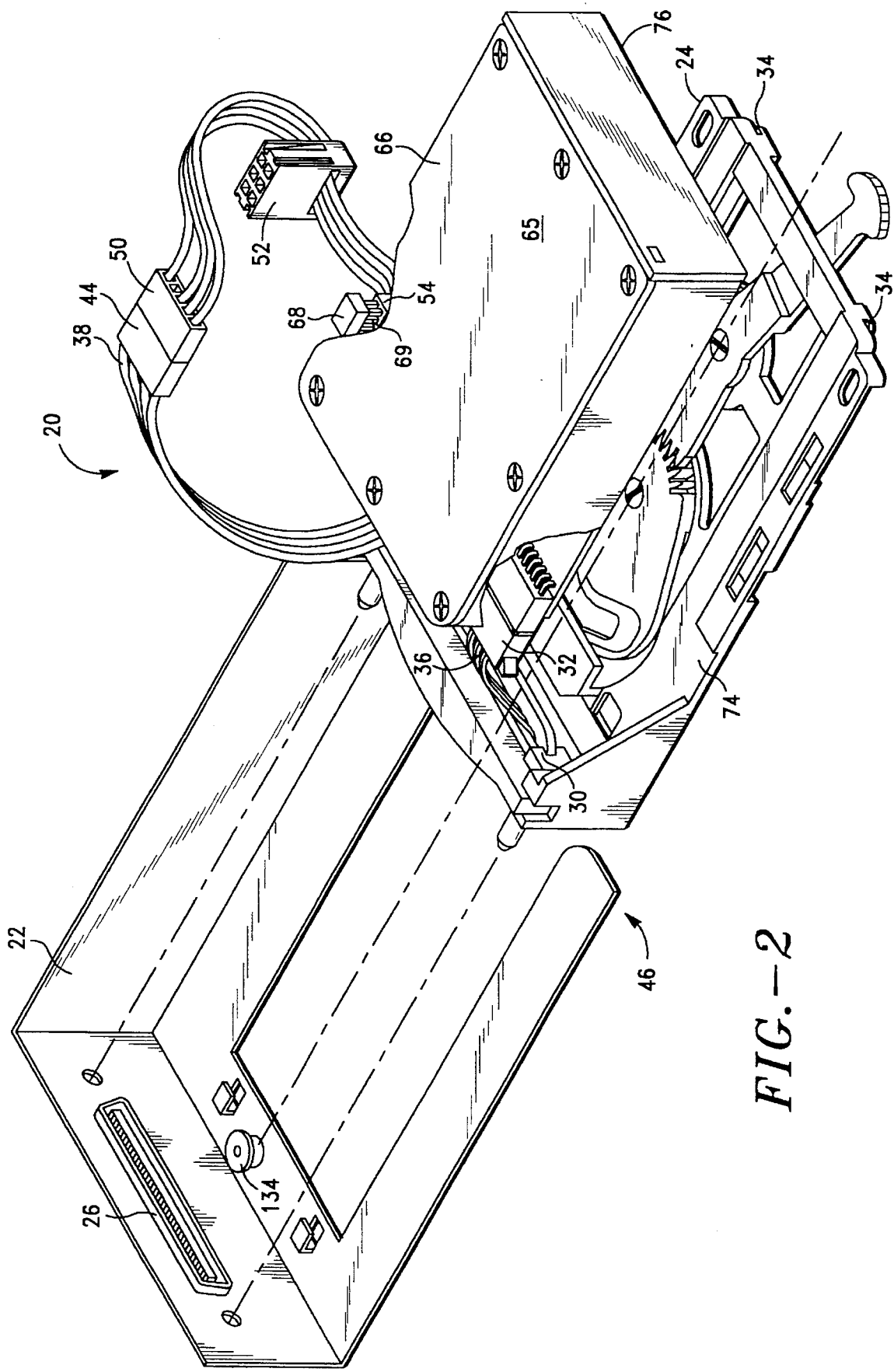
FIG. 2 is a perspective view of the SCSI ID connector assembly of FIG. 1 attached to an electrical device.

With particular reference to FIG. 2, there is shown the SCSI ID connector assembly 20 interconnecting an electrical device 65 with the equipment frame 46. In one embodiment the electrical device 65 includes a memory storage device 66. The carrier 24 of the equipment frame 46 has a base 74 which is attachable to the memory storage device 66. It can be appreciated that numerous types of electrical devices and memory storage devices 66 are contemplated by the present invention e.g. an optical disk drive, a hard disk drive, a magnetic tape drive, and similar devices are employable with the SCSI ID connector assembly 20. Additionally, numerous types of equipment frames 46 are capable of holding the electrical device 65 and identifying the electrical device 65 with an identification label (e.g. identification numeral or character) via the SCSI ID connector assembly 20.

The wiring harness 36 attaches to electrical connector 30 and extends to attach to the memory storage device 66. The wiring harness 36 facilitates data flow between the memory storage device 66 and the electronic equipment frame 46 via the carrier 24 and the slide 22. The wiring harness 36 provides power to the memory storage device 66 via the power cord 32.

In an embodiment, the memory storage device 66 is a hard disk drive. The memory storage device has an underside 76 which attaches to the base 74 of the carrier 24. An ID port 68 is configured as part of the memory storage device 66. ID pins 69 extend from the ID port 68 and align near the underside 76 of the memory storage device 66. The ID port 68 is connectable with the SCSI ID connector assembly 20. The ID port 68 connects to the SCSI ID connector assembly 20 during use. More particularly, the second terminal 54 and the feed-through connector 52 are adapted for selective attachment to a compatible ID port 68 having compatible ID pins 69. For example, a compatible ID port 68 and compatible ID pins 69 would have the same size, the same number of electrical connectors and the same ID bit sequence as either the second terminal 54 or the feed-through connector 52. The ID port 68 be of one type or another. Accordingly, the second terminal 54 is compatible with one type of ID port 68 and the feed-through connector 52 is compatible with another different type of ID port 68. Additionally, the first terminal 50 is rotatable to reverse bit sequences where connected with the ID terminal 44. Accordingly, the SCSI ID connector assembly 20 adapts the carrier 24 for use with memory storage devices having a variety of ID port 68 types. The SCSI ID connector assembly 20 facilitates compatibility with different types of configurations of ID ports on different types of memory storage devices.

The memory storage device 66 is assigned an ID label manually or via the equipment frame 46. The equipment frame 46 attaches to an electronic system such as a computer. In FIG. 2, the ID label is communicated via the SCSI ID connector assembly 20 and the carrier ID cable assembly 38 of the wiring harness 36.

Figure 3:
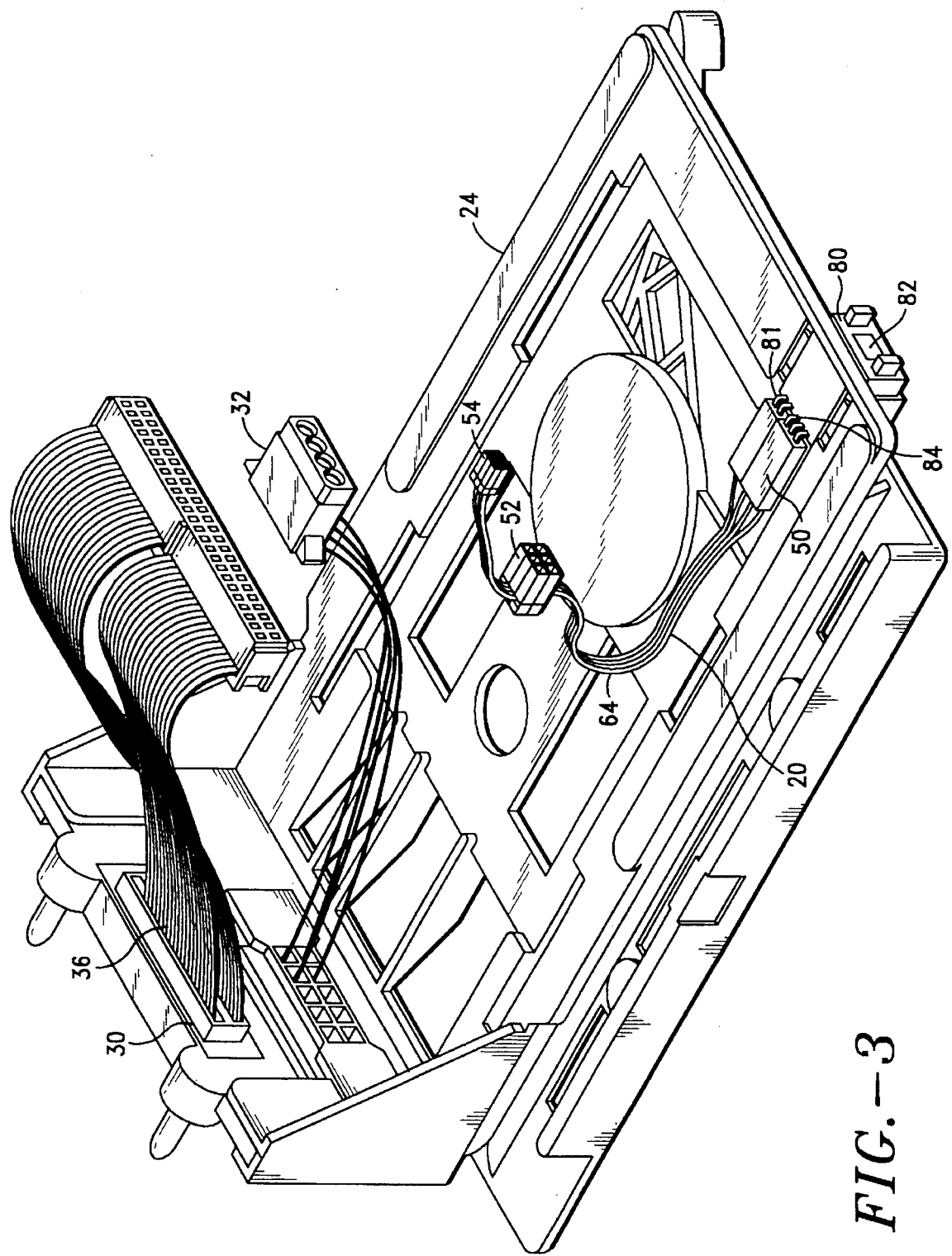
FIG. 3 is a perspective view of a SCSI ID connector assembly of FIG. 1 attached to an ID switch.

With particular reference to FIG. 3, there is shown the SCSI ID connector assembly 20 attached with the equipment frame 46. The equipment frame 46 has an ID switch 80. The ID switch 80 is manually operable to assign an ID label to an electrical device 65 (FIG. 2). The equipment frame 46 includes a carrier 24. The ID switch 80 mounts on an end of the carrier 24 of the equipment frame 46. The ID switch 80 includes an ID display 82 and an ID switch connector 84. The display 82 indicates the identification (ID) label (e.g. numeral or character) which is assigned to any electrical device which mounts on the carrier 24. The ID switch connector 84 includes a plurality of ID pins 81 which are connected with the first terminal 50 of the SCSI ID connector assembly 20. The second terminal 54 and the feed-through connector 52 selectively attach with the memory storage device 66 (FIG. 2). The operation and structure of a carrier 24 having an ID switch 80 is described in U.S. Pat. No. 5,299,944 which is incorporated herein by reference.

Figure 4:
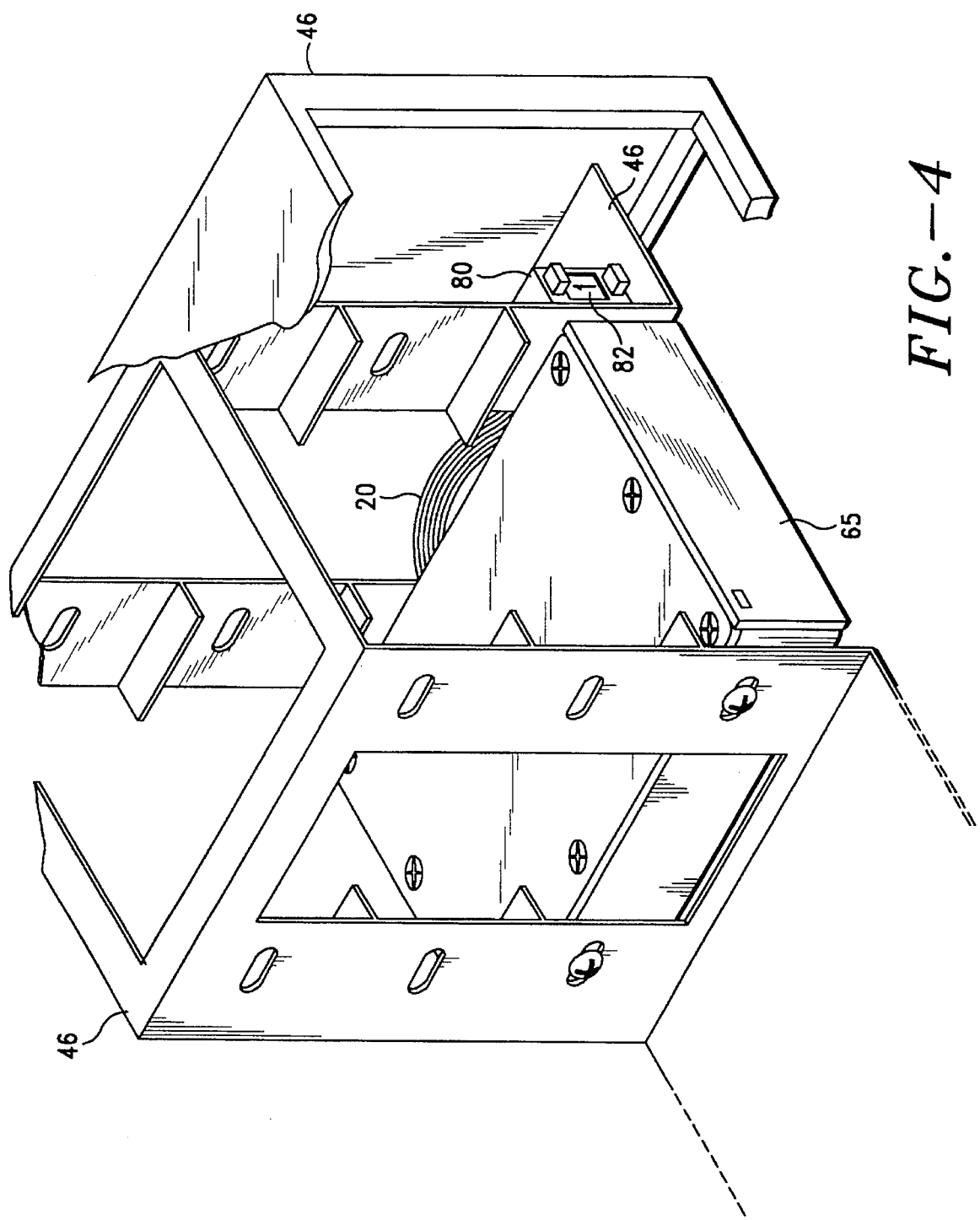
FIG. 4 is a perspective view of a SCSI ID connector assembly of FIG. 1 attached to an equipment frame.

With particular reference to FIG. 4, there is shown a SCSI ID connector assembly 20 attached to the equipment frame 46 and to the electrical device 65. The ID switch 80 attaches to the equipment frame 46. The SCSI ID connector assembly attaches to the equipment frame 46 and to the ID switch 80 as described with respect to FIGS. 2–3. The equipment frame 46 is a box for housing a any of a variety of different electrical devices 65. Although the equipment frame 46 is shown having a single electrical device 65, the equipment frame 46 can have numerous ID switches 80 and can be adapted for housing numerous different electrical devices 65 via numerous SCSI ID connector assemblies 20.

Figure 5:
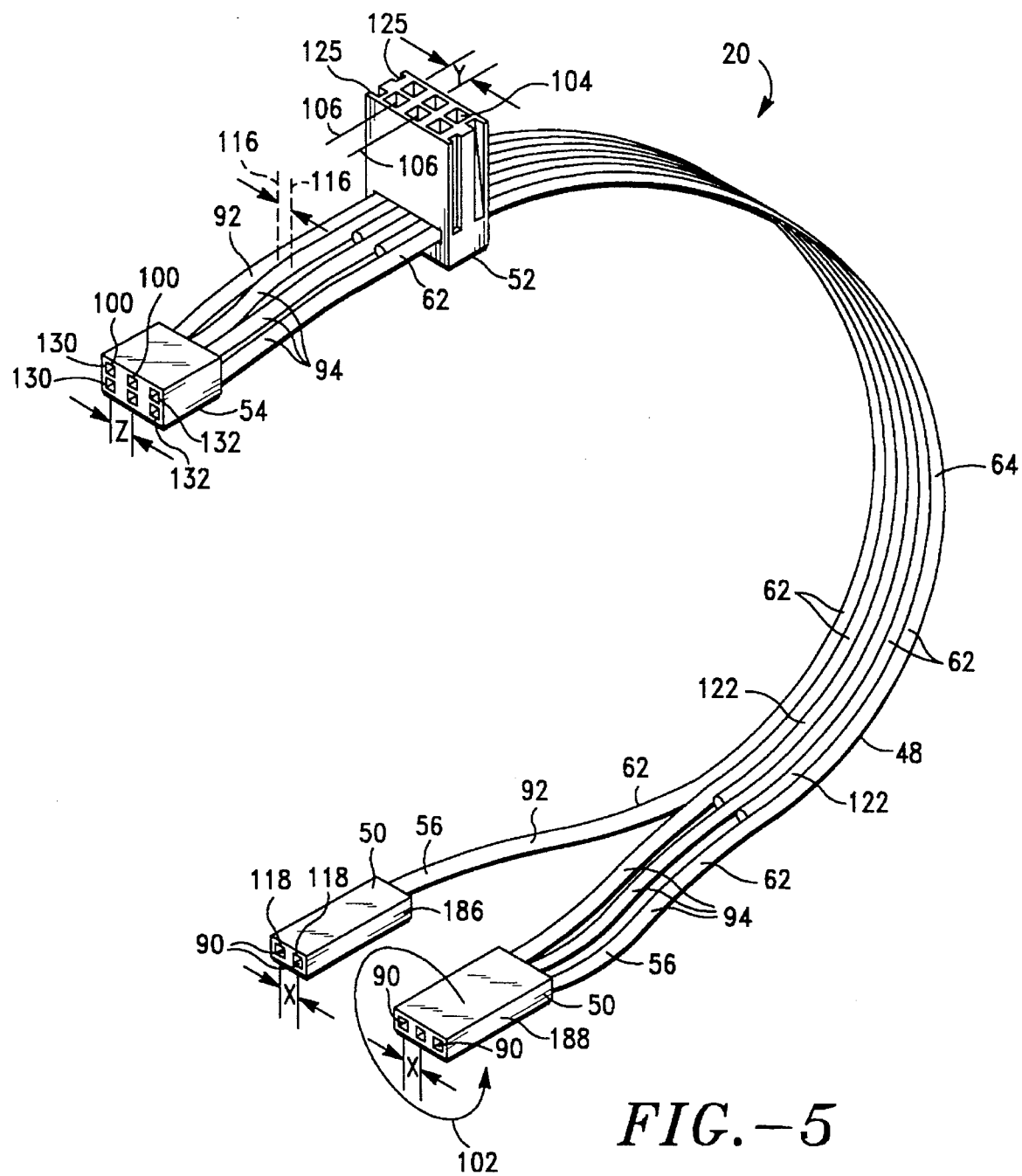
FIG. 5 is an enlarged perspective view of a preferred embodiment of the SCSI ID connector assembly of FIG. 1 in accordance with the present invention.

With particular reference to FIG. 5, there is shown the SCSI ID connector assembly 20. The SCSI ID connector assembly 20 includes the first terminal 50, the second terminal 54 and the feed through connector 52.

The first terminal 50 has an active plug 188 and a ground plug 186. The ground plug 186 has two connection ports 90. The ground plug 186 connects with a single ground wire 92. The active plug 188 has three connection ports 90. The connection ports 90 align in a single row.

The active plug 188 connects with three active wires 94. A three bit electrical connection is established through the first terminal 50 via the active plug 188 and the active wires 94. The ground plug 186 and the active plug 188 are independently attached to the first end 56 of the ID bus 48. Accordingly, the active plug 188 can rotate in the direction of the arrow 102 to be reversible with respect to the ground plug 186.

The first terminal 50 is a crimp and poke style connector, having a number of connection ports 90 axially aligned with a respective wire 62 of the ID bus 48. Crimp and poke is defined as a style of connector which attaches in axial alignment with the ID bus 48 at an end of the ID bus 48.

The wires 62 are flexible and include at least one ground wire 92 and more than one active (bit carrying) wires 94. The active wires 94 of the ID bus 48 twist from a first position where the active wires 94 are not twisted (FIG. 3) to a second position where a portion of the ID bus 48 twists 180 degrees in the direction of the arrow 102.

In an embodiment of the present invention, the ID bus 48 has six wires 62 which pass through the feed-through connector 52. Each wire includes a center 116. Each center 116 is spaced apart from an adjacent center 116 by a distance within the range of 0.025–0.05 inches. The center 116 spacing distance is 0.025 inches. In another embodiment, the center 116 spacing distance is 0.05 inches. The center 116 spacing distances can vary slightly according to industry accepted tolerances.

Each connection port 90 of the first terminal 50 has a center 118. When the ID bus 48 has a 0.05 inch wire spacing, each center 118 of the first terminal 50 is displaced 0.01 inches apart from an adjacent center 118. The distance between each center 118 is denoted by the variable x in FIG. 5.

The feed-through connector 52 attaches to the ID bus 48. The ID bus 48 passes through the feed-through connector 52. Each wire 62 of the ID bus 48 electrically connects with the feed-through connector 52. A number of the wires 62 which pass through the feed-through connector 52 electronically connect the feed-through connector 52 with the second terminal 54.

The feed-through connector 52 is a mass terminated style connector having two parallel rows 125. Mass terminated is defined as a connector style which interconnects with the ID bus 48 at a right angle without requiring a break in the ID bus 48. Each row 125 defines three contact entries 104. The contact entries 104 align perpendicularly to the wires 62 of the ID bus 48.

The contact entries 104 each have an adjacent contact entry 104. Each contact entry has a center 106. Each center 106 is separated from the adjacent contact entry center 106 by a distance within the range of 2 millimeters to 0.1 inches as denoted by the variable y in FIG. 5.

Generally, the distance y is nearly double the distance between the adjacent wire centers 116. More preferably, the ID bus 48 has wire centers 116 spaced 0.05 inches apart. The contact entry centers 106 of the feed-through connector 52 are 0.1 inches apart.

Although specific dimensions are disclosed, variations other dimensions can be employed in accordance with the present inventive concept. Various other types of feed-through connectors 52 which attach to the ID bus 48 and establish a feed-through electrical connection can be employed in accordance with the present invention instead of the mass terminated connector disclosed.

The second terminal 54 is a crimp and poke style connector which includes two parallel rows 130. Each row 130 defines uniformly spaced connection ports 90. Three connection ports 90 are in each row 130. Each connection port 90 of the second terminal 54 has an adjacent connection port 90. Each connection port 90 has a center 100. Each connection port center 100 is separated from an adjacent connection port center 100 by a distance within the range of 2 millimeters–0.010 inches as denoted by the variable z in FIG. 5.

The ID bus 48 is a ribbon cable 64 having wire centers 62 spaced 0.05 inches apart. The ribbon cable 64 has one ground wire 92 and three active wires 94 connected with the second terminal 54. The second terminal 54 connection ports 90 have centers 100 are spaced two millimeters apart.

The ID bus 48 includes at least one inert wire 122 which does not carry electric current. The inert wires 122 terminate prior to connection with the first terminal 50 and the second terminal 54 respectively. The inert wires 122 provide structural integrity to the ID bus 48 and facilitates attachment of the ID bus 48 to the feed-through connector 52. The termination of the inert wires 122 prior to connection with the first terminal 50 enhances flexibility of the first end 56 of the ID bus 48.

Figure 6:
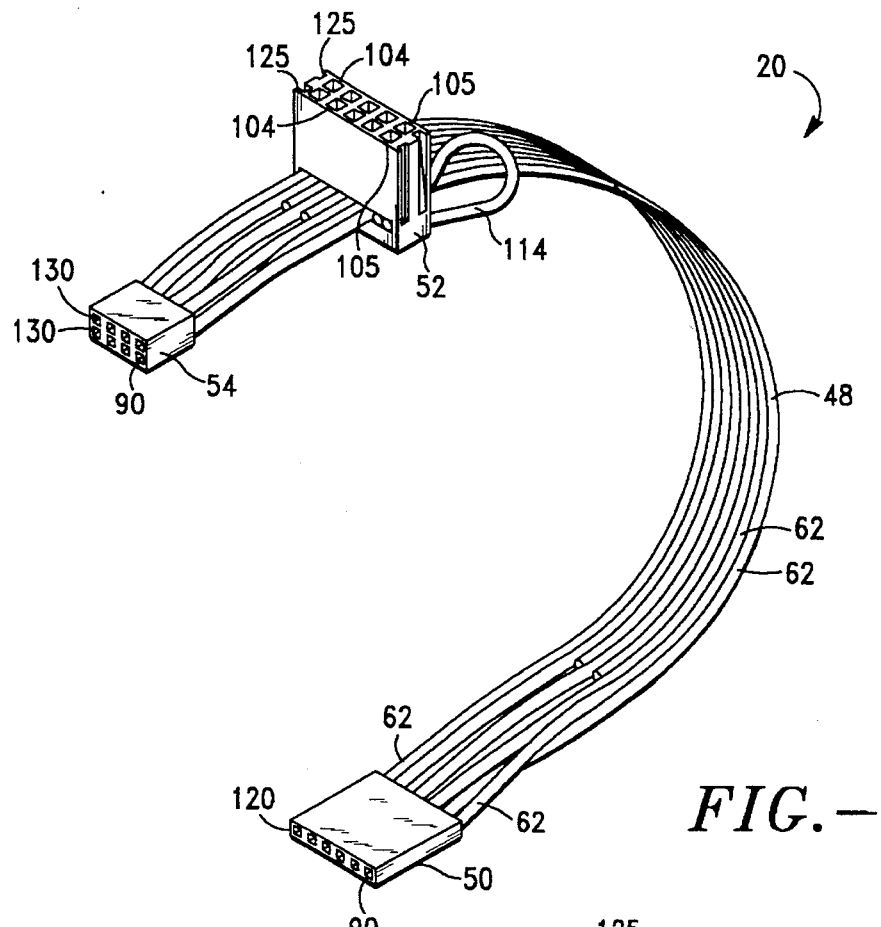
FIG. 6 is an enlarged perspective view of a preferred embodiment of the SCSI ID connector assembly of FIG. 1 in accordance with the present invention.

With particular reference to FIG. 6, there is shown an embodiment of the SCSI ID connector assembly 20. The ID bus 48 is a ribbon cable having eight wires 62. The first terminal 50 is a flat, having one row 120 of six connection ports 90. Each connection port 90 of the first terminal 50 attaches with a respective wire 62 from the ID bus 48.

The feed-through connector 52 includes two rows 125 of contact entries 104 and a wire loop 114. Each row 125 has five contact entries 104 including a first contact entry 105. The first contact entry 105 on each row 125 are interconnected by a wire loop 114. The wire loop 114 functions as a jumper. Interconnection of the two contact entries 104 adapt the feed-through connector 52 for connection to, for example, a hard disk drive having an auto start such as various hard disk drive manufactured by IBM Inc. The wire loop 114 saves space by eliminating the need for alternate electrical hardware which could consume additional space.

The second terminal 54 has two rows 130 of connection ports 90. Each row 130 has four connection ports 90. The second terminal 54 connects with six wires 62.

Figure 7:
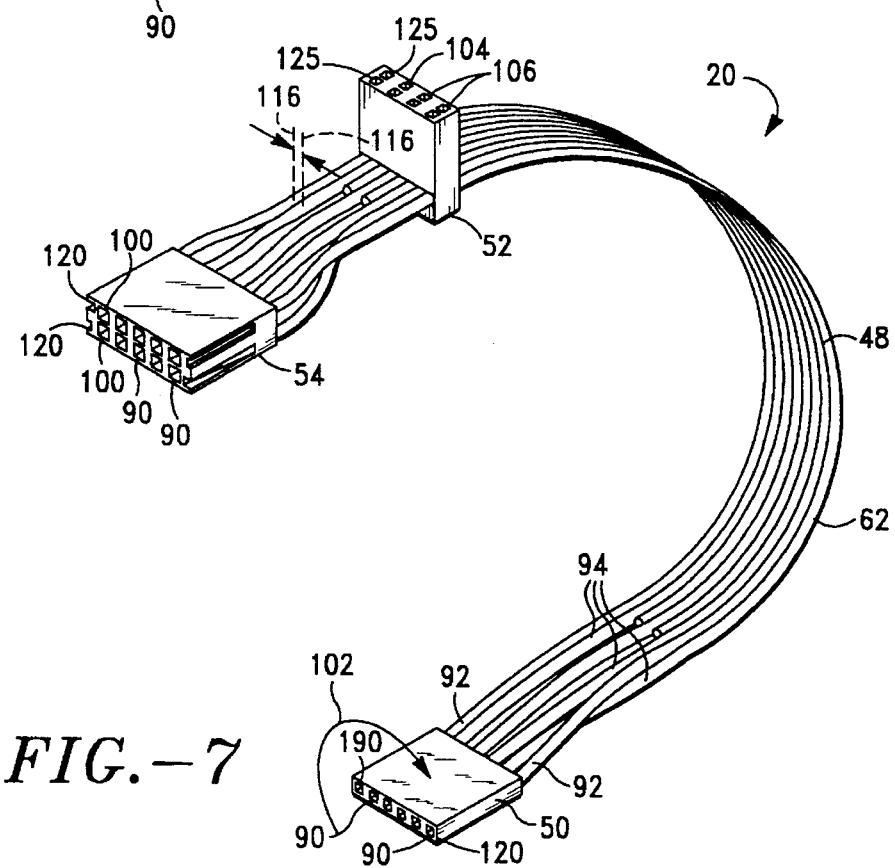
FIG. 7 is an enlarged perspective view of a preferred embodiment of the SCSI ID connector assembly of FIG. 1 in accordance with the present invention.

With particular reference to FIG. 7, there is shown an embodiment of the ID bus 48. Each wire has a center 116. Each center 116 is spaced apart 0.025 inches apart from at least one other center 116.

The feed-through connector 52 includes two rows 125 of uniformly spaced contact entries 104. Each contact entry 104 includes a center 106. The centers 106 are spaced apart 2 millimeters from an adjacent contact entry 104.

The second terminal 54 is a crimp and poke connector having two rows 120 of uniformly spaced connection ports 90. Each connection port 90 has a center 100. Each center 100 is 0.01 inches apart from an adjacent center 100.

The first terminal 50 includes a single row 120 of six connection ports 90. The first and last connection port 90 of the row 120 connect to a ground wire 92 of the ID bus 48. The remainder of the first terminal 50 connection ports 90 connect with the active wires 94.

When connection of the first terminal 50 to a appropriate electrical connector is accomplished, (FIG. 1) the sequence of active wires 94 can be selectively reversed by removing, rotating, and reconnecting the first terminal 50. With the sequence of active wires 94 reversed, the electronic sequence of bits communicated through the ID bus 48 are also selectively reversed by rotating the first terminal 50 as shown by the arrow 102. The sequence of the ground wires 92 are unaffected by rotation of the first terminal 50 because each of the two ground wires 92 are positioned on each end of the row 120.

Figure 9:
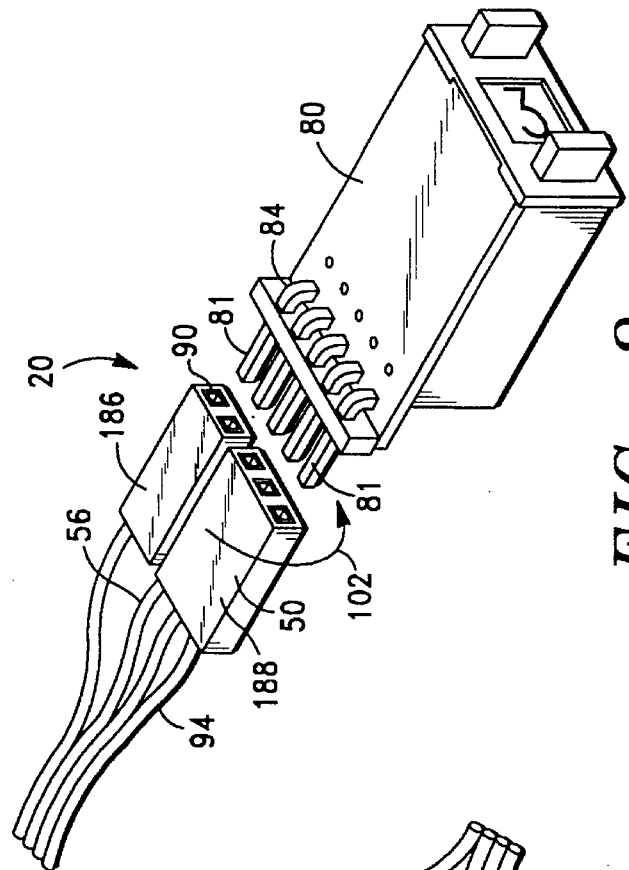
FIG. 9 is a perspective view of the SCSI ID connector assembly of FIG. 1 shown with the ID switch of FIG. 3.
Figure 8:
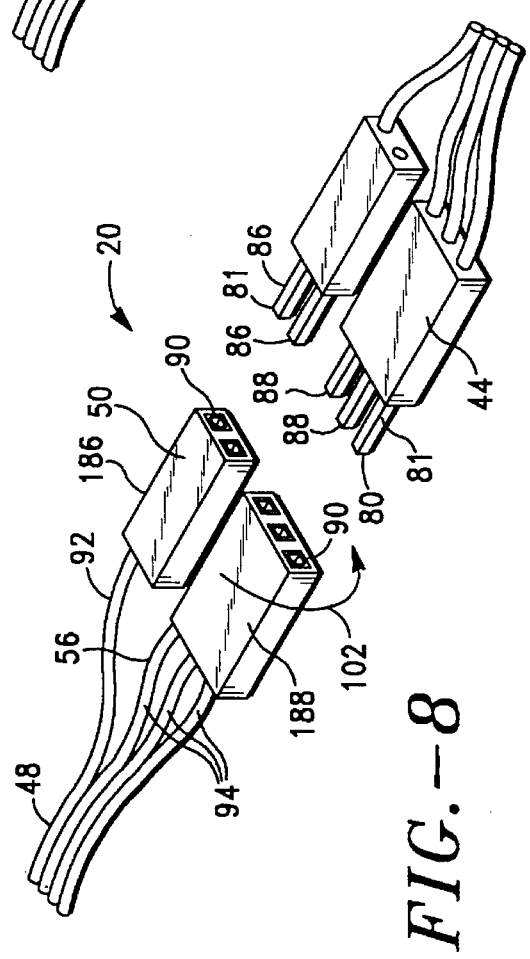
FIG. 8 is a perspective view of the first terminal of the SCSI ID connector assembly of FIG. 1 and a carrier ID terminal.

With reference to both FIG. 8 and FIG. 9, there is shown the first terminal 50 of the SCSI ID connector assembly 20. FIG. 8 shows the first terminal 50 adjacent the carrier ID terminal 44 of FIG. 1. FIG. 9. shows the first terminal 50 adjacent the ID switch 80 of FIG. 3. The ID terminal 44 and the ID switch 80 each include a number of ID pins 81. The ID pins 81 interconnect with respective connection ports 90 of the first terminal 50.

With particular reference to FIG. 8, there is shown the first end of the SCSI ID connector assembly 20 and the ID terminal 44. The ID terminal 44 includes active ID pins 88 and ground ID pins 86. The active ID pins 88 connect with the active plug 188 of the first terminal 50. The ground ID pins 86 connect with the ground plug 186 of the first terminal 50.

When the active plug 188 disconnects form the carrier ID terminal 44, it can be appreciated that rotation of the active plug 188 as shown by the arrow 102 reverses the sequence of connection ports 90. The active plug 188 rotates independently of the ground plug 186. The active plug 188 then connects with the carrier ID terminal 44 as shown in FIG. 1. Reversing the sequence of the connection ports 90 is important to reverse the bit carrying sequence of the active wires 94 to accommodate connection of the SCSI ID connector assembly with various types of memory storage devices. Accordingly, the active plug 188 is reversible.

With particular reference to FIG. 9, there is shown the ID switch 80 and the first terminal 50 of the SCSI ID connector assembly 20. The active plug 188 of the first terminal 50 is rotatable in the direction of the arrow 120 to reversibly interconnect with the ID pins 81 of the ID switch 80.

The rotation of the first terminal 50 facilitates interconnection of the SCSI ID connector assembly 20 with various memory storage devices including those having opposing ID bit sequences, for example. By rotation of the active plug 188 of the SCSI ID bus 48, as shown by the arrow 102, the order of active bit carrying wires are reversed independently of the of the ground plug 186.

Figure 10:
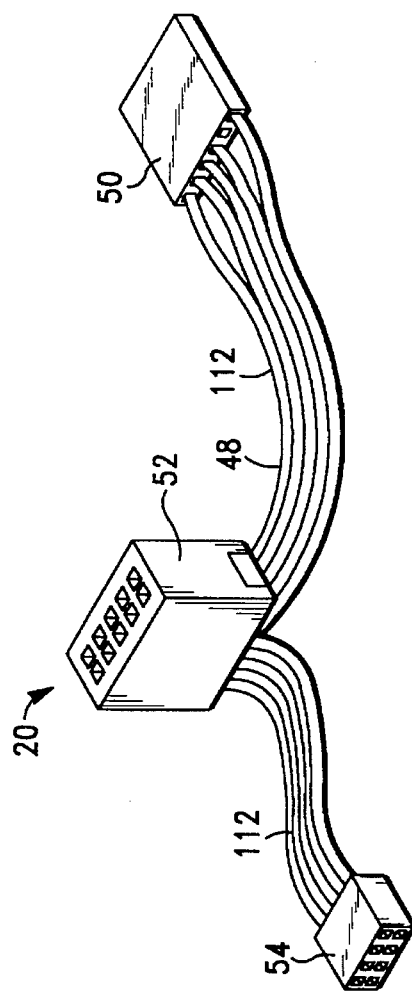
FIG. 10 is a perspective view of a preferred embodiment of the SCSI ID connector assembly of FIG. 1.

With particular reference to FIG. 10, there is shown the ID bus 48 is split into a first section 110 and a second section 112. The feed-through connector 52 is a crimp and poke connector which attaches the first section 110 of the ID bus 48 to the second section 112 of the ID bus 48.

Figure 11:
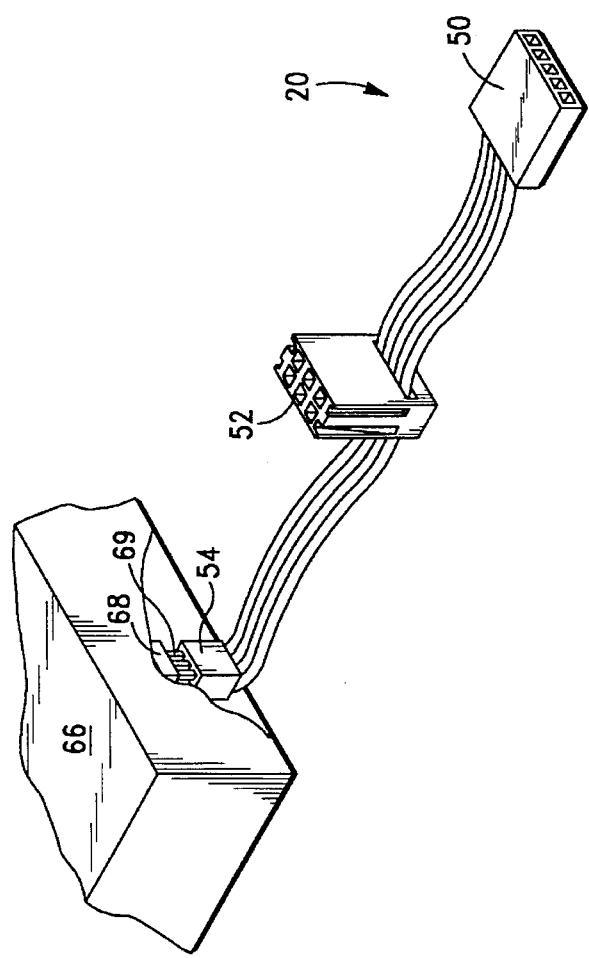
FIG. 11 is a perspective view of the SCSI ID connector assembly and the memory storage device of FIG. 2 connected together.

With particular reference to FIG. 11, there is shown the SCSI ID connector assembly 20 connected with the memory storage device 66. The second terminal 54 connects with the ID pins 69 of the ID terminal 68.

Figure 12:
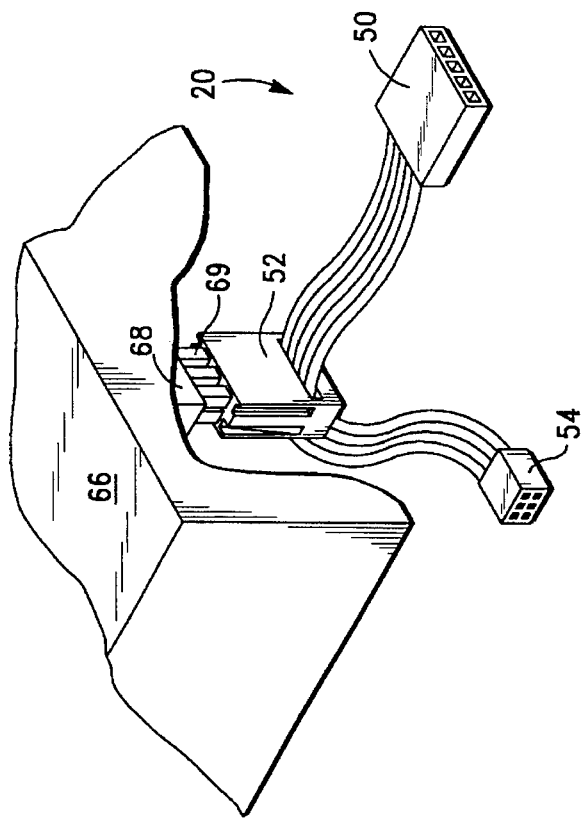
FIG. 12 is a perspective view of the SCSI connector and the memory storage device of FIG. 2 connected together.

With particular reference to FIG. 12, there is shown the SCSI ID connector assembly 20 connected with the memory storage device 66. The feed-through connector 52 connects with the ID pins 69 of the ID terminal 68.

While the foregoing detailed description has described various embodiments of the SCSI ID cable 20, it is to be understood that the above description is illustrative only and not limiting of the disclosed invention. For example, the distances separating the feed-through connector 52 contact entry centers 100, and the connection port centers 100 of the first terminal 50 and the second terminal 54 respectively can vary accordingly to industry acceptable tolerances. The length of the ID bus 48 and the relative positions of each connector on the ID bus 48 can vary.

The SCSI ID connector assembly 20 can be used in numerous applications such as with various types of equipment frames. Various equipment frames include those having ID switches and a plurality of memory storage devices affixed therein. The invention disclosed is to be limited only by the claims as set forth below.

We claim:

1. A SCSI ID connector assembly connectable between a hot swappable carrier and an electrical device having an ID port, comprising:

a carrier having a base connectable to an electrical device having an ID port, the carrier being capable of mating with a slide to facilitate hot swappability of memory storage devices;

an ID bus formed with a first end and a second end;

a first terminal attached to the first end of the ID bus, the first terminal being connectable with the carrier;

a feed-through connector attached to the ID bus; and a second terminal attached to the second end of the ID bus, the feed-through connector and the second terminal each having a configuration which is connectable with a different ID port type, whereby, when the first terminal connects with the carrier, the second terminal and the feed-through connector are selectively connectable with different ID port types to facilitate compatibility of the carrier with a variety of electrical devices.

2. A device as set forth in claim 1, wherein the first terminal includes an active plug and a ground plug, the active plug and the ground plug are independently attachable to the carrier.

3. A device as set forth in claim 2, wherein the active plug reversibly attaches to the carrier.

4. A device as set forth in claim 1, wherein the equipment frame has a manually operable ID switch, the first terminal attaches to the manually operable ID switch.

5. A device as set forth in claim 1, wherein the carrier is attachable with a slide and the electrical device is a memory storage device.

6. A SCSI ID connector assembly for use with a carrier, comprising:

a carrier for facilitating hot swappability of electrical devices, the carrier having a base, the base being slidably connectable with an equipment frame and attachable to an electrical device having an ID port;

an ID bus formed with a first end and a second end;

a first terminal attached to the first end of the ID bus, the first terminal being attachable with the carrier;

a feed-through connector electronically attached to the ID bus; and a second terminal electronically attached to the second end of the ID bus, the feed-through connector and the second terminal being respectively configured for attachment to different ID port types, whereby, when the first terminal attaches to the carrier, the second terminal and the feed-through connector are selectively attachable to different ID ports of various electrical devices to facilitate compatibility of the carrier with a variety of electrical devices.

7. An assembly as set forth in claim 6, wherein the first terminal is a crimp and poke style connector defining multiple connection ports, the equipment frame includes an ID terminal having a set of ID pins, the connection ports of the first terminal connect with the ID pins of the ID terminal.

8. An assembly as set forth in claim 6, wherein the first terminal includes a ground plug and an active plug, the ground plug and the active plug of the first terminal are independently connectable to the carrier.

9. An assembly as set forth in claim 8, wherein the active plug is rotatable, the ID bus includes flexible wires aligned in a sequence, the wires flex and the ID plug of the ID bus rotates to reverse the sequence of wires to selectively accommodate electrical devices having opposing ID bit sequences.

10. An assembly as set forth in claim 6, wherein the electrical device is a memory storage device having an ID port with multiple connection pins, the second terminal is a crimp and poke style connector having multiple connection ports for interconnection with the connection pins of the memory storage device.

11. An assembly as set forth in claim 10, wherein the feed-through connector is a mass-terminated connector having multiple contact entries, the memory storage device includes ID pins, the contact entries of the feed-through connector are configured for attachment to the connection pins of the memory storage device.

12. An assembly as set forth in claim 6, wherein the ID bus is a ribbon cable formed with six wires, each wire has a center adjacent another wire center, each wire center is within the range of 0.025–0.05 inches apart from the adjacent wire center.

13. A carrier as set forth in claim 6, wherein the second terminal defines multiple connection ports, the connection ports align in two rows.

14. A carrier as set forth in claim 13, wherein each connection port has a center adjacent another center, each connection port center is within the range of 2 millimeters to 0.1 inches apart from the adjacent center.

15. A carrier as recited in claim 6, wherein the feed-through connector defines multiple contact entries, the contact entries align in two rows.

16. A carrier as set forth in claim 15, wherein each contact entry has a center and an adjacent center, each contact entry center is within the range of 2 millimeters–00.1 inches from the adjacent contact entry center.

17. A carrier as recited in claim 6, wherein the first terminal defines multiple connection ports aligned in a single row.

18. A carrier as recited in claim 17, wherein each connection port of the first terminal includes a center, each connection port center is displaced from an adjacent connection port center by a distance within the range of 2 millimeters–00.1 inches.

19. A carrier as set forth in claim 8, wherein the ID bus is a ribbon cable having eight wires, the feed-through connector is a mass-terminated connector having multiple contact entries and a wire loop, the contact entries align in two rows, each row has five contact entries including a first contact entry, the wire loop interconnects the first contact entries.

20. A carrier as set forth in claim 19, wherein the second terminal is a crimp and poke connector defining connection ports, the connection ports align in two rows, each row includes four uniformly spaced connection ports.

21. A SCSI ID connector assembly attachable between a carrier and a memory storage device with an ID port, comprising:

a carrier having a base, the base being attachable to a memory storage device, the base being removably connectable with an equipment frame to facilitate hot swappability of memory storage devices;

a ID bus formed with a first end and a second end;

a first terminal attached to the first end of the ID bus, the first terminal being electronically connectable with the equipment frame;

a feed-through connector attached to the ID bus; and a second terminal attached to the second end of the ID bus, the feed-through connector and the second terminal being respectively configured for attachment to different ID port types, whereby, when a memory storage device having an ID port attaches to the carrier, the second terminal and the feed-through connector are selectively connectable with the ID port of the memory storage device to facilitate compatibility of the carrier with a variety of memory storage device types.

* * * * *